United States Patent
Fitting et al.

(10) Patent No.: US 11,025,356 B2
(45) Date of Patent: Jun. 1, 2021

(54) CLOCK SYNCHRONIZATION IN A MASTER-SLAVE COMMUNICATION SYSTEM

(71) Applicant: KNOWLES ELECTRONICS, LLC, Itasca, IL (US)

(72) Inventors: Andrew Fitting, Itasca, IL (US); Niel Warren, Itasca, IL (US); Geert Knapen, Itasca, IL (US)

(73) Assignee: Knowles Electronics, LLC, Itasca, IL (US)

( * ) Notice: Subject to any disclaimer, the term of this patent is extended or adjusted under 35 U.S.C. 154(b) by 0 days.

(21) Appl. No.: 16/645,408

(22) PCT Filed: Sep. 7, 2018

(86) PCT No.: PCT/US2018/049941
§ 371 (c)(1),
(2) Date: Mar. 6, 2020

(87) PCT Pub. No.: WO2019/051218
PCT Pub. Date: Mar. 14, 2019

(65) Prior Publication Data
US 2020/0287643 A1 Sep. 10, 2020

Related U.S. Application Data

(60) Provisional application No. 62/556,317, filed on Sep. 8, 2017.

(51) Int. Cl.
*H04L 7/06* (2006.01)
*H04J 3/06* (2006.01)
(Continued)

(52) U.S. Cl.
CPC ....... *H04J 3/0617* (2013.01); *H03H 17/0664* (2013.01); *H03K 3/0372* (2013.01); *H03K 7/08* (2013.01)

(58) Field of Classification Search
CPC ..... H04J 3/0617; H03H 17/0664; H03K 7/08; H03K 3/0372
(Continued)

(56) References Cited

U.S. PATENT DOCUMENTS 5,822,598 A 10/1998 Lam
6,070,140 A 5/2000 Tran
(Continued)

OTHER PUBLICATIONS

International Search Report and Written Opinion, PCT/US2018/049941, Knowles Electronics, LLC (dated Nov. 22, 2018).
(Continued)

*Primary Examiner* — Don N Vo
(74) *Attorney, Agent, or Firm* — Foley & Lardner LLP

(57) ABSTRACT

Disclosed herein include a system and a method of synchronizing a slave device to a signal from a master device based on pulse width analysis. The pulse width analysis is a process to sample the signal at a sampling frequency of the slave device, determine varying pulse widths of the sampled signal, and determine frequency of an embedded master clock signal of the signal based on statistical analysis of the varying pulse widths. Advantageously, performing pulse width analysis allows synchronization of a slave device with the embedded master clock signal in a time and cost efficient manner. In one aspect, determining a frequency of the embedded master clock signal and adjusting an internal clock of the slave device according to the determined frequency is faster and more cost efficient than iteratively adjusting the internal clock based on feedback loop based circuitries.

19 Claims, 7 Drawing Sheets

(51) Int. Cl.
*H03H 17/06* (2006.01)
*H03K 3/037* (2006.01)
*H03K 7/08* (2006.01)

(58) Field of Classification Search
USPC .................................................. 375/364–368
See application file for complete search history.

(56) References Cited

U.S. PATENT DOCUMENTS

| | | |
|---|---|---|
| 6,154,721 A | 11/2000 | Sonnic |
| 6,249,757 B1 | 6/2001 | Cason |
| 6,397,186 B1 | 5/2002 | Bush et al. |
| 6,756,700 B2 | 6/2004 | Zeng |
| 7,415,416 B2 | 8/2008 | Rees |
| 7,774,204 B2 | 8/2010 | Mozer et al. |
| 7,957,972 B2 | 6/2011 | Huang et al. |
| 8,275,148 B2 | 9/2012 | Li et al. |
| 8,666,751 B2 | 3/2014 | Murthi et al. |
| 8,972,252 B2 | 3/2015 | Hung et al. |
| 8,996,381 B2 | 3/2015 | Mozer et al. |
| 9,043,211 B2 | 5/2015 | Haiut et al. |
| 9,112,984 B2 | 8/2015 | Sejnoha et al. |
| 2005/0286643 A1* | 12/2005 | Ozawa .................... H03L 7/087 375/242 |
| 2006/0074658 A1 | 4/2006 | Chadha |
| 2011/0013689 A1 | 1/2011 | Yamazaki |
| 2012/0051465 A1 | 3/2012 | Palaniappan |
| 2012/0155589 A1* | 6/2012 | den Besten .......... H03L 7/0995 375/376 |
| 2012/0232896 A1 | 9/2012 | Taleb et al. |
| 2012/0310641 A1 | 12/2012 | Niemisto et al. |
| 2013/0223635 A1 | 8/2013 | Singer et al. |
| 2014/0163978 A1 | 6/2014 | Basye et al. |
| 2014/0244269 A1 | 8/2014 | Tokutake |
| 2014/0257821 A1 | 9/2014 | Adams et al. |
| 2014/0274203 A1 | 9/2014 | Ganong et al. |
| 2014/0278435 A1 | 9/2014 | Ganong et al. |
| 2014/0281628 A1 | 9/2014 | Nigam et al. |
| 2014/0343949 A1 | 11/2014 | Huang et al. |
| 2015/0106085 A1 | 4/2015 | Lindahl |
| 2015/0112690 A1 | 4/2015 | Guha et al. |
| 2015/0134331 A1 | 5/2015 | Millet et al. |
| 2015/0163050 A1 | 6/2015 | Han et al. |
| 2018/0287621 A1* | 10/2018 | Wesneski ............... H03K 5/135 |

OTHER PUBLICATIONS

International Preliminary Report on Patentability issued in corresponding International Application No. PCT/US2018/049941 dated Mar. 19, 2020.

\* cited by examiner

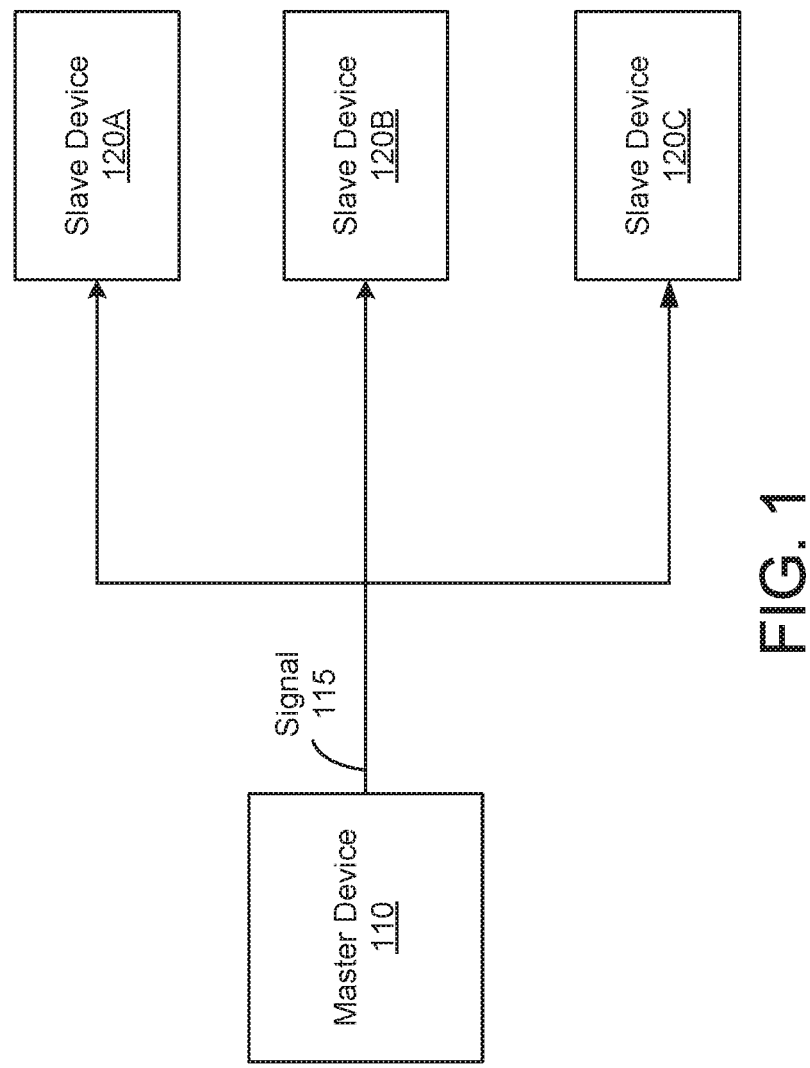

CLOCK SYNCHRONIZATION IN A MASTER-SLAVE COMMUNICATION SYSTEM

CROSS-REFERENCE TO RELATED APPLICATION

This application is a National Stage Application of PCT/US2018/049941, filed Sep. 7, 2018, which claims the benefit under 35 U.S.C. § 119(e) of provisional application No. 62/556,317, filed on Sep. 8, 2017, which is incorporated herein by reference in its entirety.

BACKGROUND

The following description is provided to assist the understanding of the reader. None of the information provided is admitted to be prior art.

In a master-slave communication system, a master device has unidirectional control over one or more slave devices. The master device may be a source device sharing content or other information with the slave devices. The slave devices may then process the information received from the master devices. In one example, a master device transmits a digital signal including digital content and an embedded master clock signal that provides timing or synchronization information (e.g., frequency, phase or both).

In some implementations, the slave device (e.g., a sink device) receives the signal transmitted from the master device and extracts the content for subsequent rendering of the content. The slave device may extract the content by sampling or otherwise processing the received signal according to its internal clock signal. For successful extraction of the content data, the slave device synchronizes the internal clock signal with the embedded master clock signal. The slave device may perform synchronization using a Clock and Data Recovery (CDR) process implemented using a phase-locked loop (PLL) or a delay-locked loop (DLL). However, when the content is not encoded there is a tendency for the CDR process to lock onto an incorrect frequency.

In some examples, a master device communicates with multiple slave devices through a shared communication channel. For example, different content for different slave devices may be time division multiplexed. When a slave device attempts to engage in the communication while other slave devices are already in communication with the master device, the slave device may not be able to synchronize the internal clock signal to the embedded master clock signal. Accordingly, the slave device may not be able to extract content data from the received signal without disrupting communication between the master device and the other slave devices.

BRIEF DESCRIPTION OF THE DRAWINGS

The foregoing and other features of the present disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings.

FIG. 1 is a block diagram of a communication system environment.

Figure 2A:
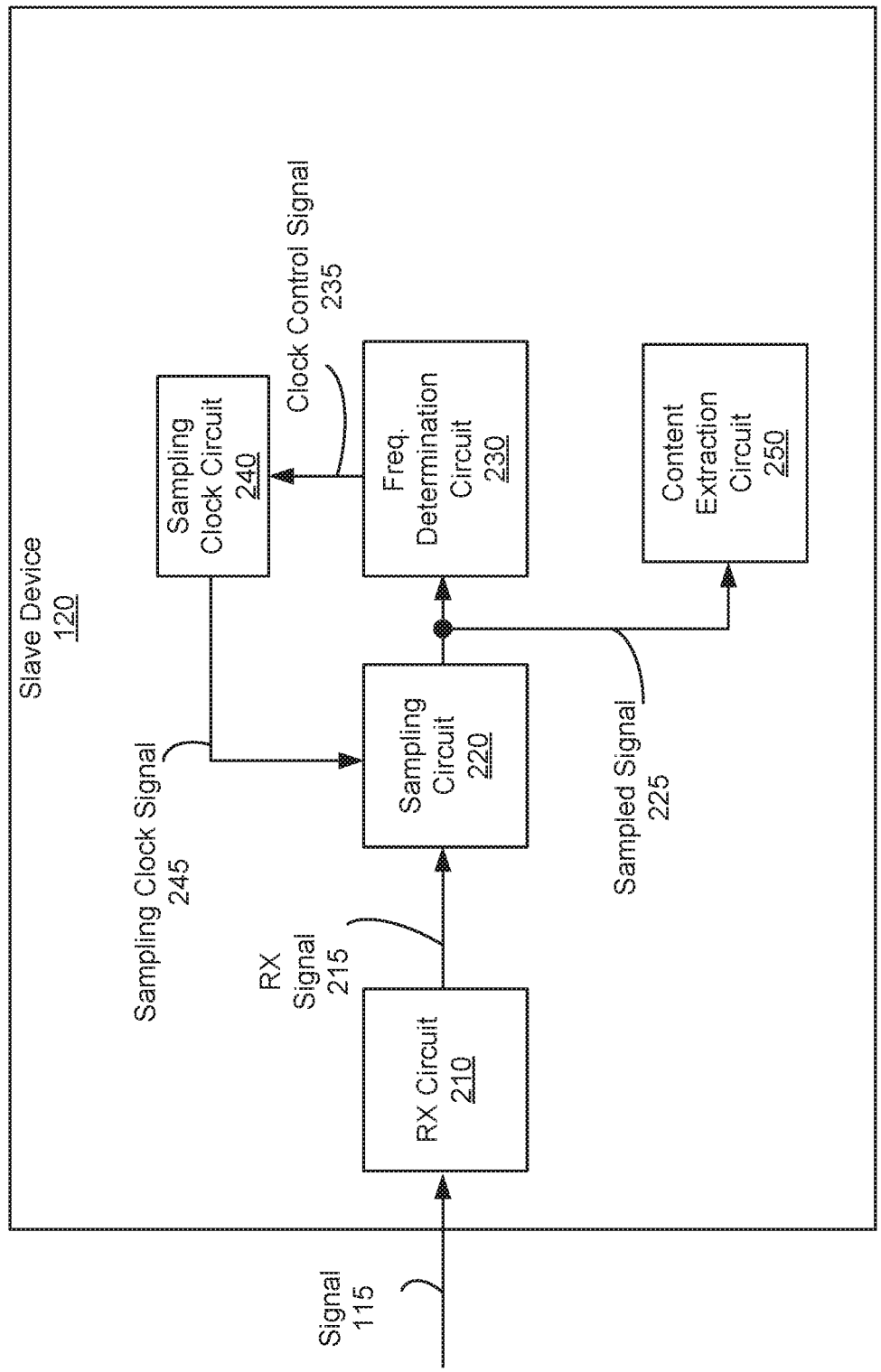
FIG. 2A is an example block diagram of a slave device.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. It will be readily understood that the aspects of the present disclosure, as generally described herein, and illustrated in the figures, can be arranged, substituted, combined, and designed in a wide variety of different configurations, all of which are explicitly contemplated and make part of this disclosure.

DETAILED DESCRIPTION

Disclosed herein include a system and method of synchronizing a slave device to a signal from a master device based on pulse width analysis. The pulse width analysis (also referred to as "run-length analysis") is a process to sample the signal at a sampling frequency of the slave device, determine varying pulse widths of the sampled signal, and determine frequency of an embedded master clock signal of the signal based on statistical analysis of the varying pulse widths. A pulse width (also referred to as "a run-length" herein) includes both a low pulse width (i.e., a pulse width of a pulse in a low state or '0' state) and a high pulse width (i.e., a pulse width of a pulse in a high state or '1' state). For example, a single pulse width of a signal having a period of 6 ns with 50% duty cycle has a 3 ns low pulse width and a 3 ns high pulse width.

Advantageously, performing pulse width analysis allows synchronization of a slave device with the embedded master clock signal in a time and cost efficient manner. In one aspect, determining a frequency of the embedded master clock signal and adjusting an internal clock of the slave device according to the determined frequency is faster and more cost efficient than iteratively adjusting the internal clock based on feedback loop based circuitries (e.g., PLL, DLL, or CDR). Accordingly, the techniques disclosed herein can improve operation of the slave device by allowing synchronization using few processor clock cycles, less power consumption, etc. In some embodiments, the slave device performs synchronization in conjunction with other feedback loop based circuitries (e.g., PLL, DLL or CDR).

In one or more embodiments, disclosed synchronization through pulse width analysis allows a slave device to join communication without disrupting communication of a master device and other slave devices. In one aspect, a slave device may be turned OFF or turned ON while a master device is in communication with other slave devices through a shared communication channel based on a time division multiplexing (TDM). When the slave device attempts to engage (or re-engage) in the communication, the slave device may synchronize the internal clock signal with the embedded master clock signal through the disclosed pulse width analysis in a seamless manner without interrupting communication between the master device and the other slave devices. In various embodiments, the disclosed slave device may perform synchronization with or without disrupting communication between the master device and the other slave devices.

Referring to FIG. 1, illustrated is a block diagram of a master-slave communication system 100 including a master device 110 and slave devices 120A, 120B, 120C (one or more of which may be referred to as "slave device 120"). The master device 110 and the slave devices 120 communicate with each other through a common communication link. A communication link may comply with any wired communication protocol (e.g., Ethernet, USB, HDMI, MHL, SoundWire, etc.) through conductive wires, traces, or differential bus. Alternatively, the communication link may comply with any wireless communication protocol (e.g., Bluetooth, NFC, WiFi, cellular communication, satellite communication, etc.) through wireless channels. Generally, the slave devices communicate with the master device through shared communication link or separate communication links. In FIG. 1, communications occur on a time division multiplexed (TDM) multi-drop bus, implemented using a differential pair of wires, wherein each slave device is assigned a different time slot.

The master device 110 is a hardware communication device that transmits a signal 115 to one or more slave devices 120. The content may be obtained from internal memory of the master device or from an external source. The content data may be un-encoded or raw data of audio, video, or any combination thereof. The signal communicated by the master device 110 includes digital content and an embedded master clock signal (e.g., embedded synchronization signal) indicating timing information (e.g., frequency, phase, or both). The embedded master clock signal may be a sync pulse or a preamble signal. The master device 110 may generate a common signal with content for the slave devices 120 and communicate with the slave devices 120 using a time division multiplexed (TDM) scheme.

The slave device 120 is a hardware communication device that receives a signal 115, and extracts a content signal from the signal 115 for reproducing content corresponding to the content signal. In one aspect, the slave device 120 performs pulse width analysis on the signal 115 to determine a frequency of an embedded master clock signal of the signal 115, and extracts the content signal from the signal 115 by sampling the signal 115 according to the determined frequency. The slave device 120 may render an audio representation, a video representation, or both according to the extracted content signal. Example architecture of the slave device 120 and example process of performing the pulse width analysis are described with respect to FIGS. 2 through 6 below.

Referring to FIG. 2A, illustrated is an example block diagram of the slave device 120 in accordance with various implementations. In one embodiment, the slave device 120 includes a receiving circuit 210 (also referred to as "a RX circuit 210" herein), a sampling circuit 220, a frequency determination circuit 230, a sampling clock circuit 240, and a content extraction circuit 250. These components operate together to perform pulse width analysis to determine a frequency of the embedded master clock signal of the signal 115, and extract a content signal from the signal 115 according to the determined frequency. In some embodiments, some components of the slave device 120 may be embodied as application specific integrated circuit (ASIC) or field programmable gate array (FPGA). In some embodiments, some components of the slave device 120 may be replaced by a processor executing instructions stored by a memory device (e.g., non-transitory computer readable medium) to perform functionality of such components. In other embodiment, the slave device 120 includes more, fewer, or different components than shown in FIG. 2A.

The RX circuit 210 is a front end component of the slave device 120 that receives the signal 115 through a communication link and obtains a receive signal 215 (also referred to as "a RX signal 215" herein). In one embodiment, the RX circuit 210 includes an input coupled to an output of the master device 110 through a communication link, and an output coupled to an input of the sampling circuit 220. The RX circuit 210 may be an amplifier, a filter, or a combination of them that amplifies the signal 115 or filters noise in the signal 115 to obtain the RX signal 215 with a better signal to noise ratio than the signal 115. The RX circuit 210 outputs the RX signal 215 to the sampling circuit 220 through its output. In some embodiments, the RX circuit 210 may be omitted and the communication link may be directly coupled to the sampling circuit 220, such that the sampling circuit 220 can directly receive the signal 115 from the master device 110 through the communication link.

The sampling circuit 220 is a component that samples the RX signal 215 to obtain the sampled signal 225, based on which pulse width analysis can be performed. In one implementation, the sampling circuit 220 includes a first input coupled to the output of the RX circuit 210, a second input coupled to an output of the sampling clock circuit 240, and an output coupled to an input of the frequency determination circuit 230 and an input of the content extraction circuit 250. In this configuration, the sampling circuit 220 receives the sampling clock signal 245 from the sampling clock circuit 240, and samples the RX signal 215 according to the sampling clock signal 245 to generate a sampled signal 225. The sampling circuit 220 may sample the RX signal 215 for a predetermined sampling time period. The sampling circuit 220 transmits the sampled signal 225 to the frequency determination circuit 230 through its output.

The frequency determination circuit 230 is a component that determines a frequency of an embedded master clock signal in the signal 115 based on the sampled signal 225. In one or more embodiments, the frequency determination circuit 230 includes the input coupled to the output of the sampling circuit 220, and an output coupled to an input of the sampling clock circuit 240. The frequency determination circuit 230 performs statistical analysis (e.g., histogram analysis) on the sampled signal 225 to determine the frequency of the embedded master clock signal. In one approach, the frequency determination circuit 230 determines varying pulse widths of the sampled signal 225. In one aspect, a pulse width (or a run-length) is determined by counting a number of clock cycles according to the sampling clock signal 245. For example, assuming that a period or a clock cycle of the sampling clock signal is 1 ns, and three clock cycles of the sampling clock signal is observed for the pulse in a given state, then the pulse width of the given state can be determined to be 3 ns and represented as '3' sampling clock cycles. In another aspect, a pulse width is selected from a set of pulse widths within a predetermined range (e.g., +/−15%). In addition, the frequency determination circuit 230 counts, for each pulse width, a corresponding number of occurrences. Moreover, the frequency determination circuit 230 may determine two smallest pulse widths, and obtains an average of the two pulse widths. Based on the average, the frequency determination circuit 230 may determine the frequency of the embedded master clock signal. For example, the frequency determination circuit 230 determines whether a pulse width corresponding to a peak number of occurrences is an integer multiple of the average. If the pulse width corresponding to the peak number of occurrences is an integer multiple of the average, the frequency determination circuit 230 determines an inverse of the average or an integer multiple of the inverse to be the frequency of the embedded master clock signal. If the pulse width corresponding to the peak number of occurrences is not an integer multiple of the average, the frequency determination circuit 230 may obtain additional samples and repeat the process to determine the frequency of the embedded master clock signal. An example process of performing the statistical analysis on the sampled signal 225 is provided below with respect to FIG. 3.

Additionally, the frequency determination circuit 230 generates a clock control signal 235 according to the determined frequency. The clock control signal 235 is an analog signal or a digital signal indicative of a target frequency of the sampling clock signal 245. The frequency determination circuit 230 may include a mapping between frequencies of the sampling clock signal 245 and corresponding representations (e.g., voltage, current, or bits) of the clock control signal 235. In addition, the frequency determination circuit 230 may identify a representation of the clock control signal 235 corresponding to the determined frequency through the mapping. The frequency determination circuit 230 generates the clock control signal 235 according to the determined representation, and transmits the clock control signal 235 to the sampling clock circuit 240 through its output.

The sampling clock circuit 240 is a variable controlled clock circuit (e.g., a voltage controlled oscillator or a digital controlled oscillator) that generates the sampling clock signal 245 according to the clock control signal 235. In one embodiment, the sampling clock circuit 240 includes an input coupled to the output of the frequency determination circuit 230, and an output coupled to an input of the sampling circuit 220. In this configuration, the sampling clock circuit 240 generates the sampling clock signal 245 at a frequency corresponding to a representation of the clock control signal 235, and transmits the sampling clock signal 245 to the sampling circuit 220. When performing pulse width analysis, the sampling clock circuit 240 may increase a frequency of the sampling clock signal 245 to oversample the RX signal 215. For example, the sampling clock signal 245 may be an integer multiple (e.g., two or four) times an expected frequency of the embedded master clock signal. The sampling clock frequency may be determined by analyzing how long it takes to see a single bit by itself, e.g., '00100.' This can either be a probabilistic calculation or it can be based on some known sequence, e.g., if all control words contain a single run and they occur at some known rate.

The content extraction circuit 250 is a component that extracts the content signal from the RX signal 215. In one embodiment, the content extraction circuit 250 includes an input coupled to the output of the sampling circuit 220. In this configuration, the content extraction circuit 250 receives the sampled signal 225, and extracts the content data from the sampled signal 225. The content extraction circuit 250 may be disabled while the frequency determination circuit 230 determines a frequency of the embedded master clock signal, and enabled after the frequency determination circuit 230 determines the frequency of the embedded master clock signal. After the frequency determination circuit 230 determines the frequency of the embedded master clock signal, the sampled signal 225 from the sampling circuit 220 may be synchronized with the embedded master clock signal. The content extraction circuit 250 may remove the embedded master clock signal from the RX signal 215 to extract the content signal. The content extraction circuit 250 may provide the extracted content signal to an output driver circuit (e.g., a speaker, a display, or both), by which audio representation, video representation, or both may be rendered. In some embodiments, the content extraction circuit 250 and the sampling circuit 220 are implemented as a single component.

Figure 2B:
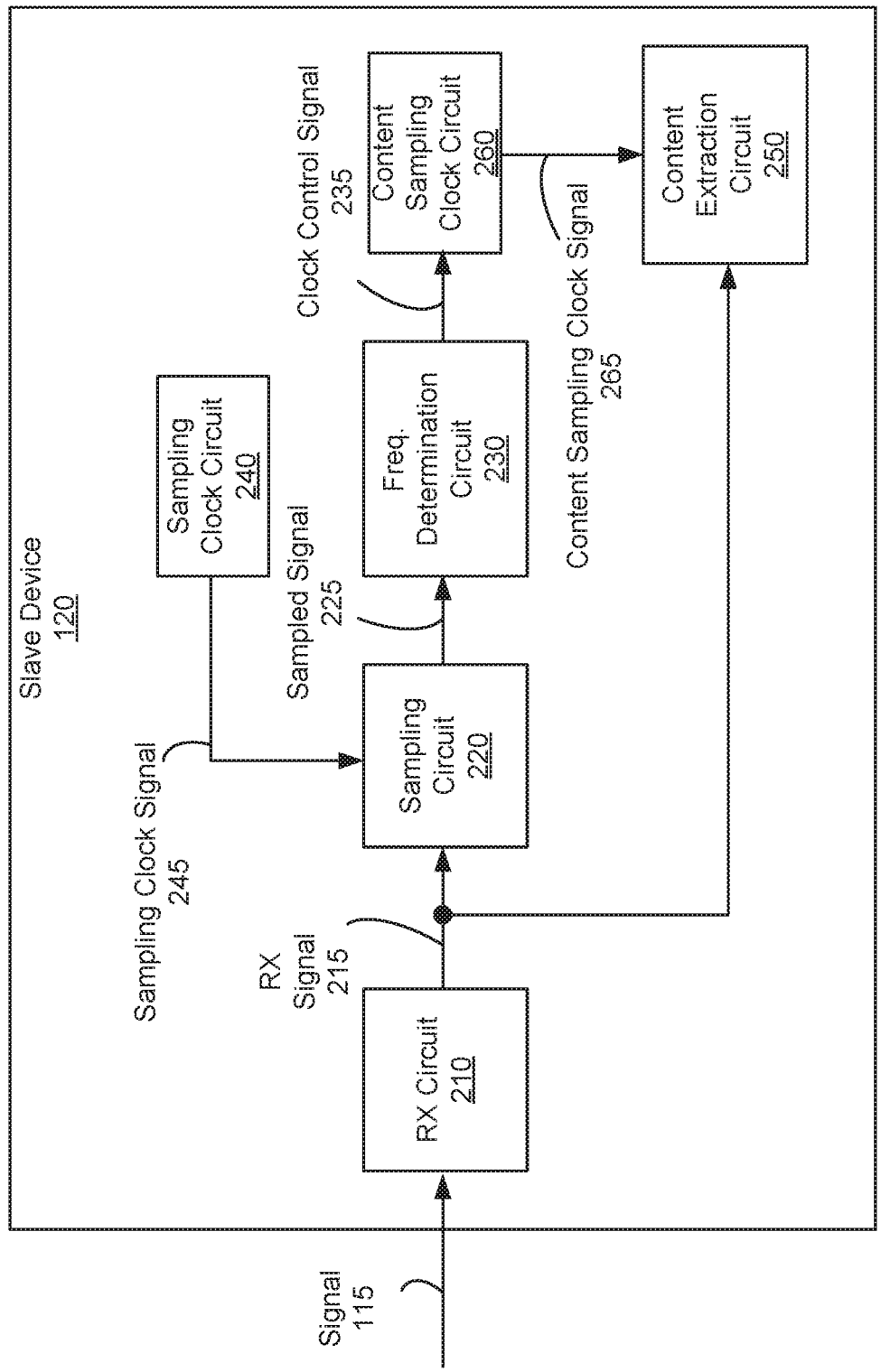
FIG. 2B is another example block diagram of the slave device.

Referring to FIG. 2B, illustrated is another example block diagram of the slave device 120, according to another embodiment. In FIG. 2B, the RX circuit 210, sampling circuit 220, frequency determination circuit 230, the sampling clock circuit 240, and the content extraction circuit 250 are similar to the ones in FIG. 2A, except that the sampling clock circuit 240 operates independent of the frequency determination circuit 230; an additional content sampling clock circuit 260 is provided; and the content extraction circuit 250 is coupled to the RX circuit 210. In particular, in this embodiment, the content sampling clock circuit 260 is coupled between the frequency determination circuit 230 and the content extraction circuit 250, and provides a content sampling clock signal 265 as indicated by the clock control signal 235 from the frequency determination circuit 230. In one aspect, the sampling clock circuit 240 outputs the sampling clock signal 245 at a fixed frequency that is higher than (e.g., four times) an expected frequency of the embedded master clock signal, where the content sampling clock circuit 260 may output the content sampling clock signal 265 with a variable frequency controlled according to the clock control signal 235. In this configuration, the content extraction circuit 250 may sample the RX signal 215 according to the content sampling clock signal 265 from the content sampling clock circuit 260, and remove the embedded master clock signal from the sampled signal to extract the content signal from the RX signal 215.

Figure 3:
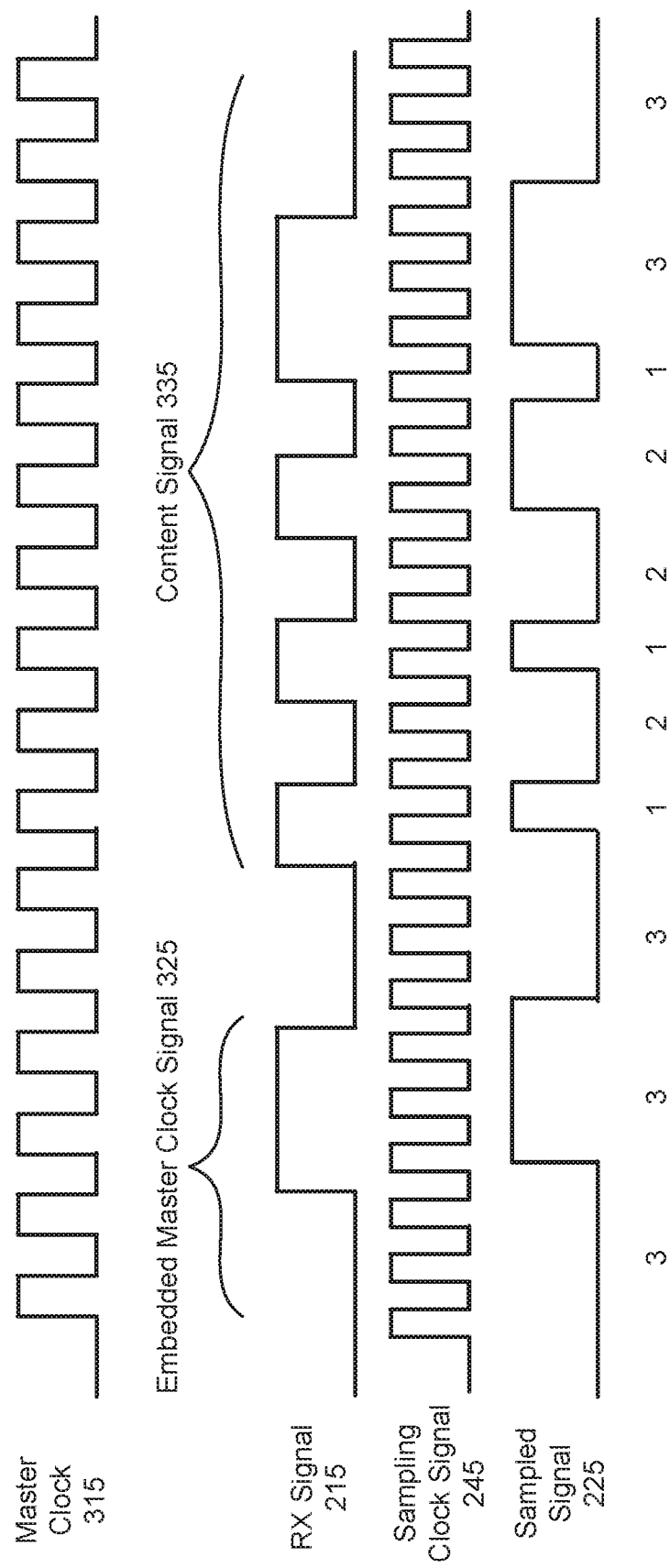
FIG. 3 is an example timing diagram for performing synchronization based on pulse width analysis.

Referring to FIG. 3, illustrated is an example timing diagram for performing synchronization based on pulse width analysis by the slave device 120 of FIG. 2A or FIG. 2B in accordance with various implementations. In FIG. 3, example waveforms of a master clock 315, RX signal 215, sampling clock signal 245 and sampled signal 225 are shown.

The master device 110 generates the signal 115 according to the master clock 315. For example, the master device 110 generates a content signal of the signal 115 according to timing information of the master clock 315. In this example, the RX signal 215 received by the RX circuit 210 is synchronized with a falling edge of the master clock 315.

Figure 4:
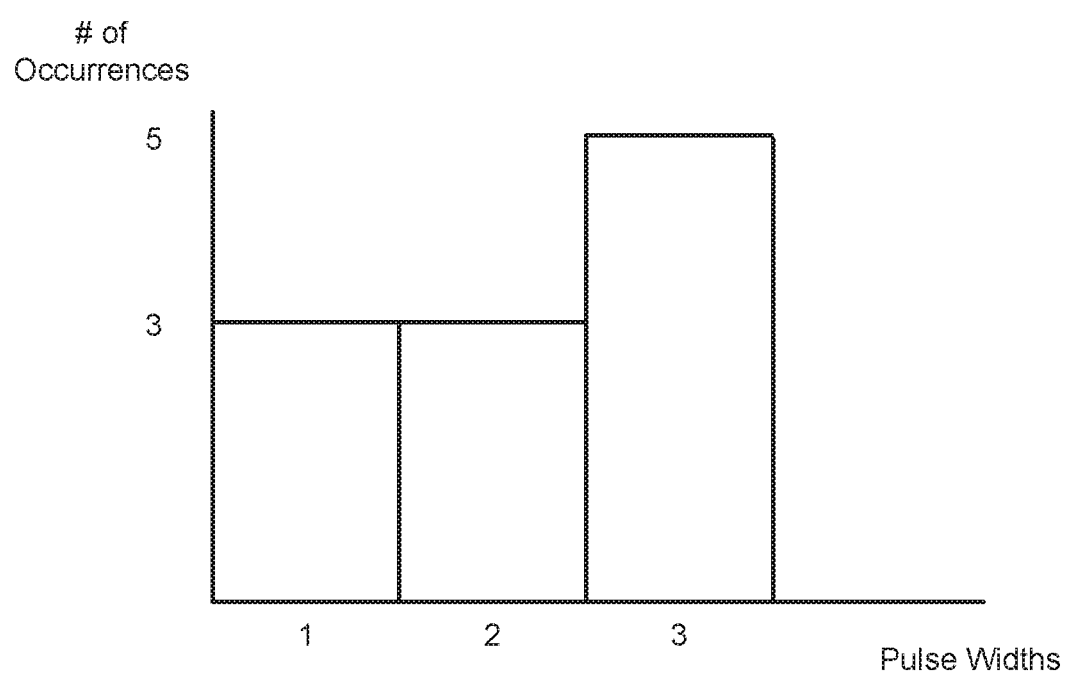
FIG. 4 is an example histogram of different pulse widths of the timing diagram of FIG. 3.

The slave device 120 receives the signal 115 from the master device 110, and obtains the RX signal 215. The RX signal 215 may be amplified, filter, or both amplified and filtered signal of the signal 115. The RX signal 215 includes an embedded master clock signal 325 indicating timing information of the master clock 315, and a content signal 335 representing un-encoded raw data. The slave device 120 samples the RX signal 215 according to an internal sampling clock signal 245 to obtain the sampled signal 225. The slave device 120 further performs statistical analysis on the sampled signal 225. In one approach, the slave device 120 determines varying pulse widths of the sampled signal 225. The slave device 120 may determine the varying pulse widths according to the sampling clock signal 245. For example, the slave device 120 counts run-lengths or a number of clock cycles of the sampling clock signal 245 until a state of the sampled signal 225 changes as a pulse width. In one aspect, the slave device 120 determines the varying pulse widths irrespective of whether pulse widths are low pulses or high pulses. For example, the slave device 120 determines that the sampled signal 225 includes pulse widths of {3, 3, 3, 1, 2, 1, 2, 2, 1, 3, 3} sampling clock cycles, and determines that a pulse width of '1' sampling clock cycle has three occurrences, a pulse width of '2' sampling clock cycle has three occurrences, and a pulse width of '3' sampling clock cycle has five occurrences. The slave device 120 may obtain a histogram as shown in FIG. 4 according to the number of occurrences determined, and determine that a pulse width of '3' sampling clock cycle has the peak number of occurrences. The slave device 120 may determine a subset of the pulse widths (e.g. '1,' and '2' sampling clock cycles) having the lowest pulse widths, and determine an average of the pulse widths of '1,' and '2,' sampling clock cycles. The slave device 120 determines a frequency of the embedded master clock signal 325 based on the average. For example, the slave device 120 determines that the pulse width of '3' sampling clock cycles corresponding to the peak number of occurrences is an integer multiple of the average pulse width of '1.5' clock cycles. Moreover, the slave device 120 determines an inverse of the average or an integer multiple of the inverse to correspond to the frequency of the embedded master clock signal 325. For example, if the average pulse width corresponds to 100 µs, the slave device 120 determines that the frequency of the embedded master clock signal 325 to be 10 kHz or an integer multiple of the 10 kHz.

Figure 5:
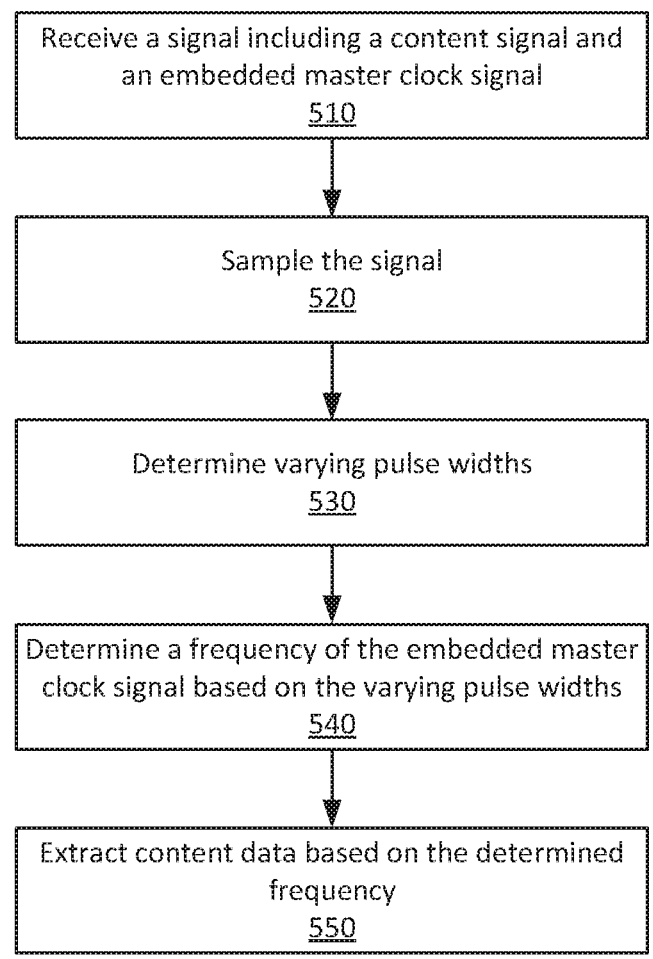
FIG. 5 is a flow chart illustrating a process of synchronizing a slave device to an embedded master clock signal from a master device according to pulse width analysis.

Referring to FIG. 5, illustrated is a flow chart showing a process 500 of synchronizing a slave device to an embedded master clock signal from a master device according to pulse width analysis in accordance with various implementations. The steps in FIG. 5 may be performed by the slave device 120 of FIG. 2A or FIG. 2B. In other embodiments, the steps may be performed by other entities. In other embodiments, the process 500 includes additional, fewer, or different steps than shown in FIG. 5.

At step 510, the slave device 120 receives a signal 115 including a content signal and an embedded master clock signal.

At step 520, the slave device 120 samples the received signal (signal 115 or RX signal 215) to obtain the sampled signal 225. The slave device 120 may sample the received signal according to an internal sampling clock signal 245 for a predetermined sample time period.

At step 530, the slave device 120 determines varying pulse widths of the sampled signal 225. Pulse widths may be determined according to the internal sampling clock signal 245, and irrespective of whether pulses are low pulses or high pulses, as described above with respect to FIG. 4.

At step 540, the slave device 120 determines a frequency of the embedded master clock signal based on the varying pulse widths. In one approach, the slave device 120 performs statistical analysis on the varying pulse widths of the sampled signal 225, as described below with respect to FIG. 6.

At step 550, the slave device 120 extracts content data from the received signal based on the determined frequency. Without synchronization through iterative feedback, determining a frequency of the embedded master clock signal through pulse width analysis disclosed herein renders fast and inexpensive approach of extracting content data from the received signal.

Figure 6:
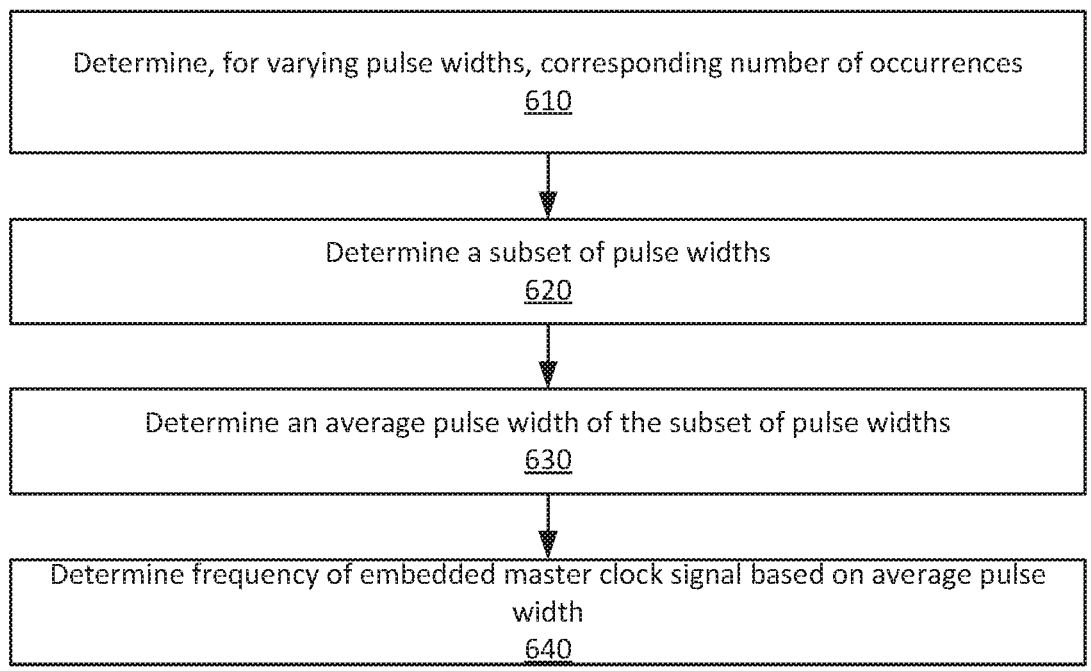
FIG. 6 is a flow chart illustrating a process of determining a frequency of an embedded master clock signal according to run-length analysis.

Referring to FIG. 6, illustrated is a flow chart of a process 600 of determining a frequency of an embedded master clock signal according to pulse width analysis in accordance with various implementations. The steps in FIG. 6 may be performed by the slave device 120 (e.g., frequency determination circuit 230) of FIG. 2A or FIG. 2B. In other embodiments, the steps may be performed by other entities. In other embodiments, the process 600 includes additional, fewer, or different steps than shown in FIG. 6.

At step 610, the slave device 120 determines, for varying pulse widths, corresponding number of occurrences.

At step 620, the slave device 120 determines a subset of pulse widths. The slave device 120 may determine from different numbers of occurrences, a first pulse width having the lowest number of occurrences and a second pulse width having the next lowest number of occurrences.

At step 630, the slave device 120 determines an average pulse width of the subset of pulse widths. The subset of the pulse widths may be two shortest pulse widths.

At step 640, the slave device 120 determines a frequency of an embedded mater clock signal based on the average pulse width. In one approach, the slave device 120 determines a pulse width corresponding to a peak number of occurrences, and determines if the pulse width corresponding to the peak number of occurrences is an integer multiple of the average pulse width. If the pulse width corresponding to the peak number of occurrences is the integer multiple, the slave device 120 determines an inverse of the average pulse width or an integer multiple of the inverse to be the frequency of the embedded master clock signal. If the pulse width corresponding to the peak number of occurrences is not the integer multiple, the slave device 120 may obtain additional samples and repeat the process.

Advantageously, disclosed synchronization based on pulse width analysis prevents false locking to periodic patterns in un-encoded data. In one aspect, un-encoded data may have periodic patterns that are sub-harmonic (e.g., ½, ¼, etc.) of a frequency of the embedded master clock signal. For example, the un-encoded data may have a periodic pattern of '0011.' Synchronization through CDR may render the internal clock to be locked with ½ of the frequency of the embedded master clock. Through the disclosed synchronization based on the pulse width analysis, the slave device may successfully synchronize its internal clock to the embedded master clock signal, while obviating false locking due to, e.g., the periodic pattern of the un-encoded data.

Although disclosed synchronization in one or more embodiments is based on pulse width or run-length analysis, in some embodiments, synchronization may be performed based on statistical analysis of other characteristics of the embedded master clock signal. For example, a slave device may determine a frequency of the embedded master clock signal based on statistical analysis of a duty cycle of the embedded master clock signal, and successfully extract content data based on the determined frequency. In one approach, the slave device 120 (or the frequency determination circuit 230) detects a pulse with a predetermined duty cycle (e.g., 30% duty cycle) or a predetermined range of duty cycle (e.g., between 25~35% duty cycle), and applies different weights when counting a number of occurrences. For example, assuming that the predetermined duty cycle is ⅓, the slave device 120 (or the frequency determination circuit 230) detects a pulse having a pattern '000011,' and counts an occurrence of the high pulse width '2' sampling clock cycles to be two instead of one to provide additional weights. Accordingly, statistical analysis can be performed with additional weights for a pulse width corresponding to a predetermined duty cycle, or a predetermined pattern, thereby improving accuracy of the prediction of the frequency of the embedded master clock signal.

Embodiments disclosed herein are related to a receiving device. In one or more embodiments, the receiving device includes a receiver circuit configured to receive a signal. The signal comprises a content signal and an embedded master clock signal. The receiving device further includes a sampling circuit coupled to the receiver circuit. The sampling circuit is configured to sample the signal at a first sampling frequency. The receiving device further includes a frequency determination circuit coupled to the sampling circuit. The frequency determination circuit is configured to: determine varying pulse widths of the sampled signal, and determine a second sampling frequency of the embedded master clock signal based at least in part on the varying pulse widths of the sampled signal. The receiving device further includes a content extraction circuit coupled to the frequency determination circuit and the receiver circuit. The content extraction circuit is configured to extract the content signal according to the second sampling frequency.

Embodiments disclosed herein are related to a receiving device. In one or more embodiments, the receiving device is configured to receive a signal comprising a content signal and an embedded master clock signal. The receiving device is further configured to sample the signal at a first sampling frequency. The receiving device is further configured to determine varying pulse widths of the sampled signal, and determine a second sampling frequency of the embedded master clock signal based at least in part on the varying pulse widths of the sampled signal. The receiving device is further configured to extract the content signal according to the second sampling frequency. In some embodiments, the receiving device comprises circuitry configured to perform the aforementioned functions.

Various embodiments of a receiving device are disclosed herein. In some embodiments, a receiving device includes a receiver circuit configured to receive a signal including digital content and an embedded master clock signal. The receiving device further includes a sampling circuit coupled to the receiver circuit. The sampling circuit is configured to sample the signal at a sampling frequency. The receiving device further includes a frequency determination circuit coupled to the sampling circuit. The frequency determination circuit is configured to determine a frequency of the embedded master clock signal based on a number of occurrences of pulses having substantially the same pulse width. The receiving device further includes a content extraction circuit coupled to the frequency determination circuit and the receiver circuit. The content extraction circuit is configured to extract the digital content according to the determined frequency.

In one or more embodiments, the embedded master clock is a synchronization pulse. The content may represent un-encoded data. The content may include un-encoded audio data. In some embodiments, the content represents encoded data or encoded audio data.

In one or more embodiments, the sampling frequency is higher than an expected frequency of the embedded master clock signal.

In one or more embodiments, the frequency determination circuit is configured to determine the number of occurrences of the pulses having substantially the same pulse width by counting a number of sampling frequency pulses within each pulse width, determine a subset of varying pulse widths including two smallest pulse widths, and determine an average pulse width of the subset of the varying pulse widths. The frequency of the embedded master clock signal may be determined based on the average pulse width.

In one or more embodiments, the frequency determination circuit is further configured to: determine a pulse width corresponding to a peak number of occurrences, determine whether the determined pulse width is an integer multiple of the average pulse width, and determine the frequency of the embedded master clock signal to be an integer multiple of an inverse of the average pulse width, in response to the determined pulse width being the integer multiple of the average pulse width.

In one or more embodiments, the frequency determination circuit is further configured to obtain additional samples of the signal, in response to the determined pulse width not being the integer multiple of the average pulse width.

Various embodiments of a method in a slave communication device are disclosed herein. The method includes receiving a signal comprising unencoded digital content and an embedded master clock signal. The method further includes sampling the signal at a sampling frequency. The method further includes determining a number of occurrences of pulses having substantially the same pulse width. The method further includes estimating a frequency of the embedded master clock signal based on the number of occurrences of pulses having substantially the same pulse width. The method further includes extracting the digital content by processing the signal at the estimated frequency.

In one or more embodiments, the embedded master clock signal is a synchronization pulse.

In one or more embodiments, the signal represents un-encoded data.

In one or more embodiments, the signal represents audio data.

In one or more embodiments, the signal is sampled at the sampling frequency that is higher than an expected frequency of the embedded master clock signal.

In one or more embodiments, the method further includes: determining, for each of different pulse widths, a corresponding number of occurrences; determining, from varying pulse widths, a subset of the varying pulse widths including two smallest pulse widths; determining an average pulse width of the subset of the varying pulse widths; and determining the frequency of the embedded master clock signal based on the average pulse width.

In one or more embodiments, the method further includes: determining a pulse width corresponding to a peak number of occurrences; determining whether the determined pulse width is an integer multiple of the average pulse width; and determining the frequency of the embedded master clock signal to be an integer multiple of an inverse of the average pulse width, in response to the determined pulse width being the integer multiple of the average pulse width.

In one or more embodiments, the method further includes obtaining additional samples of the signal, in response to the determined pulse width not being the integer multiple of the average pulse width.

Various embodiments of a slave communication device are disclosed herein. The slave communication device includes a receiver circuit configured to receive a signal including unencoded digital content and an embedded synchronization signal. The slave communication device further includes a sampling circuit coupled to the receiver circuit. The sampling circuit has a sampling frequency that exceeds an expected frequency of the synchronization signal and is configured to determine a characteristic of the signal. The slave communication device includes a frequency determination circuit coupled to the sampling circuit. The frequency determination circuit is configured to determine a frequency of the synchronization signal based on a number of occurrences of the characteristic of the signal. The slave communication device includes a content processing circuit coupled to the frequency determination circuit and the receiver circuit. The content processing circuit is configured to extract the unencoded digital content according to the determined frequency.

In one or more embodiments, the characteristic of the signal is a pulse width. The frequency determination circuit may be configured to determine the number of occurrences of the pulses having substantially the same pulse width, determine a subset of varying pulse widths based on corresponding numbers of occurrences, and determine an average pulse width of the subset of the varying pulse widths. The frequency of the embedded synchronization signal may be determined based on the average pulse width.

In one or more embodiments, the characteristic of the signal is a duty cycle. The frequency determination circuit may be configured to determine a number of occurrences of pulses having substantially the duty cycle, determine a subset of varying pulse widths based on corresponding numbers of occurrences, and determine an average pulse width of the subset of the varying pulse widths. The frequency of the embedded synchronization signal may be determined based on the average pulse width.

The foregoing description of illustrative embodiments has been presented for purposes of illustration and of description. It is not intended to be exhaustive or limiting with respect to the precise form disclosed, and modifications and variations are possible in light of the above teachings or may be acquired from practice of the disclosed embodiments. It is intended that the scope of the invention be defined by the claims appended hereto and their equivalents.

What is claimed is:

1. A receiving device comprising:
a receiver circuit configured to receive a signal, the signal comprising digital content and an embedded master clock signal, the signal including pulses;
a sampling circuit coupled to the receiver circuit, the sampling circuit configured to sample the signal at a sampling frequency;
a frequency determination circuit coupled to the sampling circuit, the frequency determination circuit configured to determine a frequency of the embedded master clock signal based on a number of occurrences of pulses of the signal having substantially the same pulse width; and
a content extraction circuit coupled to the frequency determination circuit and the receiver circuit, the content extraction circuit configured to extract the digital content according to the determined frequency.

2. The receiving device of claim 1, wherein the embedded master clock signal is a synchronization pulse.

3. The receiving device of claim 2, wherein the content represents un-encoded data.

4. The receiving device of claim 2, wherein the content includes un-encoded audio data.

5. The receiving device of claim 1, wherein the sampling frequency is higher than an expected frequency of the embedded master clock signal.

6. The receiving device of claim 1, wherein the frequency determination circuit is configured to:
determine the number of occurrences of the pulses having substantially the same pulse width by counting a number of sampling frequency pulses within each pulse width,
determine a subset of the varying pulse widths including two smallest pulse widths,
determine an average pulse width of the subset of the varying pulse widths, and
wherein the frequency of the embedded master clock signal is based on the average pulse width.

7. The receiving device of claim 6, wherein the frequency determination circuit is further configured to:
determine a pulse width corresponding to a peak number of occurrences,
determine whether the determined pulse width is an integer multiple of the average pulse width, and
determine the frequency of the embedded master clock signal to be an integer multiple of an inverse of the average pulse width, in response to the determined pulse width being the integer multiple of the average pulse width.

8. The receiving device of claim 7, wherein the frequency determination circuit is further configured to:
obtain additional samples of the signal, in response to the determined pulse width not being the integer multiple of the average pulse width.

9. A method in a slave communication device, the method comprising:
receiving a signal comprising unencoded digital content and an embedded master clock signal, the signal including pulses;
sampling the signal at a sampling frequency;
determining a number of occurrences of pulses of the signal having substantially the same pulse width;
estimating a frequency of the embedded master clock signal based on the number of occurrences of pulses having substantially the same pulse width; and
extracting the digital content by processing the signal at the estimated frequency.

10. The method of claim 9, wherein the embedded master clock signal is a synchronization pulse.

11. The method of claim 9, wherein the signal represents un-encoded data.

12. The method of claim 9, wherein the signal represents audio data.

13. The method of claim 9, wherein the signal is sampled at the sampling frequency that is higher than an expected frequency of the embedded master clock signal.

14. The method of claim 9, further comprising:
determining, for each of the different pulse widths, a corresponding number of occurrences;
determining, from the varying pulse widths, a subset of the varying pulse widths including two smallest pulse widths;
determining an average pulse width of the subset of the varying pulse widths; and
determining the frequency of the embedded master clock signal based on the average pulse width.

15. The method of claim 14, further comprising:
determining a pulse width corresponding to a peak number of occurrences;
determining whether the determined pulse width is an integer multiple of the average pulse width; and
determining the frequency of the embedded master clock signal to be an integer multiple of an inverse of the average pulse width, in response to the determined pulse width being the integer multiple of the average pulse width.

16. The method of claim 15, further comprising:
obtaining additional samples of the signal, in response to the determined pulse width not being the integer multiple of the average pulse width.

17. A slave communication device comprising:
a receiver circuit configured to receive a signal including unencoded digital content and an embedded synchronization signal, the signal comprising pulses;
a sampling circuit coupled to the receiver circuit, the sampling circuit having a sampling frequency that exceeds an expected frequency of the synchronization signal and configured to determine a characteristic of the signal;
a frequency determination circuit coupled to the sampling circuit, the frequency determination circuit configured to determine a frequency of the synchronization signal based on a number of occurrences of the characteristic of the signal; and
a content processing circuit coupled to the frequency determination circuit and the receiver circuit, the content processing circuit configured to extract the unencoded digital content according to the determined frequency.

18. The slave communication device of claim 17, the characteristic of the signal is a pulse width, wherein the frequency determination circuit is configured to determine:
the number of occurrences of the pulses having substantially the same pulse width,
determine a subset of varying pulse widths based on corresponding numbers of occurrences, and
determine an average pulse width of the subset of the varying pulse widths, wherein the frequency of the embedded synchronization signal is determined based on the average pulse width.

19. The slave communication device of claim 17, the characteristic of the signal is a duty cycle, wherein the frequency determination circuit is configured to determine:
a number of occurrences of pulses having substantially the duty cycle,
determine a subset of varying pulse widths based on corresponding numbers of occurrences, and
determine an average pulse width of the subset of the varying pulse widths, wherein the frequency of the embedded synchronization signal is determined based on the average pulse width.

* * * * *